(12) United States Patent
Arnez et al.

(10) Patent No.: US 8,145,961 B2
(45) Date of Patent: *Mar. 27, 2012

(54) FAST ECC MEMORY TESTING BY SOFTWARE INCLUDING ECC CHECK BYTE

(75) Inventors: Andreas Arnez, Schoenaich (DE); Joerg-Stephan Vogt, Holzgerlingen (DE)

(73) Assignee: International Business Machines Corporation, Armonk, NY (US)

( * ) Notice: Subject to any disclaimer, the term of this patent is extended or adjusted under 35 U.S.C. 154(b) by 960 days.

This patent is subject to a terminal disclaimer.

(21) Appl. No.: 12/122,753

(22) Filed: May 19, 2008

(65) Prior Publication Data

US 2008/0229176 A1    Sep. 18, 2008

Related U.S. Application Data

(63) Continuation of application No. 11/013,678, filed on Dec. 16, 2004, now Pat. No. 7,376,887.

(30) Foreign Application Priority Data

Dec. 22, 2003    (EP) .................................... 03104911

(51) Int. Cl.
*G01R 31/28*    (2006.01)

(52) U.S. Cl. ...................... 714/724; 714/718; 365/201

(58) Field of Classification Search .................. 714/718, 714/724; 365/201
See application file for complete search history.

(56) References Cited

U.S. PATENT DOCUMENTS

| | | | |
|---|---|---|---|
| 4,974,184 A | 11/1990 | Avra .............................. 708/252 |
| 6,134,684 A | 10/2000 | Baumgartner et al. ....... 714/724 |
| 6,282,134 B1 * | 8/2001 | Kumar .......................... 365/201 |
| 6,381,715 B1 * | 4/2002 | Bauman et al. ............... 714/718 |
| 6,938,193 B1 * | 8/2005 | Honda .......................... 714/720 |
| 7,062,696 B2 | 6/2006 | Barry et al. ................... 714/738 |
| 7,149,869 B2 * | 12/2006 | Singh ............................ 711/173 |
| 7,149,947 B1 | 12/2006 | MacLellan et al. ........... 714/758 |
| 7,165,153 B2 * | 1/2007 | Vogt .............................. 711/154 |
| 7,249,296 B2 * | 7/2007 | Hirabayashi .................. 714/718 |
| 7,272,774 B2 * | 9/2007 | Co et al. ........................ 714/764 |
| 2005/0044467 A1 | 2/2005 | Leung et al. .................. 714/763 |

* cited by examiner

*Primary Examiner* — Esaw Abraham
(74) *Attorney, Agent, or Firm* — Dennis Jung, Esq.; Blanche E. Schiller, Esq.; Heslin Rothenberg Farley & Mesiti P.C.

(57) ABSTRACT

The present invention relates to the architecture and operation of computer hardware memory logic, and in particular to a method and respective system for verifying hardware memory logic, wherein an Error Correction Code (ECC) is used for correcting single-bit or multi-bit errors when the ECC-bits cannot be accessed directly for a read or write process. The system and process employs the selection of data patterns that produce check bits that are all ones to ferret out errors in the ECC circuitry.

10 Claims, 2 Drawing Sheets

FAST ECC MEMORY TESTING BY SOFTWARE INCLUDING ECC CHECK BYTE

CROSS-REFERENCE TO RELATED APPLICATIONS/PATENTS

This application is a continuation of U.S. application Ser. No. 11/013,678 filed Dec. 16, 2004 now U.S. Pat. No. 7,376,887, issued May 20, 2008, entitled "METHOD FOR FAST ECC MEMORY TESTING BY SOFTWARE INCLUDING ECC CHECK BYTE, Arnez et al., the entirety of which is hereby incorporated herein by reference.

FIELD OF THE INVENTION

The present invention relates to the architecture and operation of computer hardware memory logic, and in particular to a method and respective system for verifying hardware memory, wherein an Error Correction Code (ECC) is used for correcting single-bit or multi-bit errors, and wherein the ECC-bits cannot be accessed directly for a read or write process.

DESCRIPTION AND DISADVANTAGES OF PRIOR ART

At boot time or during runtime many computer systems of different types and categories—be it high-performant server systems or personal computers or processing units in embedded systems—execute a memory test. This is done, in order to assure a correct operation of the computer memory, which is working closely with the computer's processor. In computing systems such memory is called DRAM (Dynamic Random Access Memory). Some prior art memory test procedures write a data pattern (such as 0h or A5A5A5A5h) (hexadecimal) and its respective complement into the memory. When each bit toggles from one to the other value, then the data section of the memory is free from stuck bit errors. Other test procedures write a different pattern to each memory location, such as the address of that memory location and its complement, and also check if the bit locations toggle from one to the other value. By doing this, such software makes sure that every data bit is toggled and not stuck at 0 or 1.

In addition to the pure data space a memory of a higher quality computer also comprises a relatively small section, in which the above-mentioned Error Correction Code (ECC) is stored and operated, in order to correct single-bit errors and detect multi-errors. Each data pattern is thus associated with an ECC pattern. The ECC memory section covers approximately 10-20% of the overall memory.

A problem is that the ECC section cannot be directly accessed bitwise or bytewise by such memory test procedure software. This is true for nearly all computer systems. In order to test the proper operability of the ECC section the user has to use special test patterns that result in known ECC byte patterns.

Prior art solutions in this area have different implementations to perform such ECC test procedures: for example the Power PC 405 GP application note describes a table of known data patterns and the resulting ECC bytes such that a user can create a 0, FF, so-called walking 0's and walking 1's in the ECC byte. This is a very time-consuming test for software and needs 8-10, minimum 4 read/write cycles for every memory location. Here, the user is not free to choose the test data pattern or to define a test that concurrently initializes the memory with a given data set.

The prior art AMIDiag diagnostic tool contains a chipset-specific memory test with ECC on 440 FX, 440 LX, 440 BX, 450 NX & pro fusion. It is a general PC diagnostics utility for a limited set of implementations and not suited for a fast test at boot time.

Further, the prior art mem-test 86 does not include any special test for ECC-protected memory. The same is true with the prior art ultra-XRAM-stress-test tool. Thus, in the latter tests the ECC section is simply not tested.

Further prior art test procedures, such as MATS+ or GAL-PAT row aim at finding errors in the memory with the full knowledge about the internal architecture and layout of the memory. They use sophisticated algorithms to check for address/data line shorts, stuck-bits, cross-talk etc. In a system environment these time-consuming tests can be used only if the memory architecture is known. For a user of a memory unit, however, the precise memory architecture is not known, thus such tests are not applicable.

OBJECTIVES OF THE INVENTION

It is thus an objective of the present invention, to improve ECC memory testing.

SUMMARY AND ADVANTAGES OF THE INVENTION

This objective of the invention is achieved by the features stated in enclosed independent claims. Further advantageous arrangements and embodiments of the invention are set forth in the respective subclaims. Reference should now be made to the appended claims.

The present invention is based basically on the knowledge that the problem of the usual prior art test methods using a given data pattern and its complement is that the complement of any pattern creates the same ECC byte as the pattern itself. Thus, a memory location used to store the check byte for the data pattern is not modified during the pure data pattern test. For a fixed data pattern, it is quite straight-forward to find a data value that generates the complement of the ECC byte, just by trial-and-error or by solving the ECC matrix equation.

According to the basic aspect of the present invention a method and respective system for verifying hardware memory logic is disclosed, wherein an Error Correction Code (ECC) is used for correcting single-bit or multi-bit errors, and wherein the ECC bits cannot be accessed directly for a read or write process. The inventional method is characterized by the steps of:

a) using a data pattern X, that generates a predetermined ECC checksum C("1") by solving an equation (1), which may be done by importing X from any external resource, or by generating it directly:

$$E*X=C(\text{``1''}) \qquad (1)$$

wherein:
E is a known ECC matrix (n×m), where n is the number of data bits and m is the number of check bits,
X is a data pattern consisting of n bits fulfilling said equation (1), and
C("1") is a check bit string consisting of m bits, wherein all bits have the logical value of "1", b) generating a data pattern P3 by calculating a term (2) or (2'):

$$\text{b1) } P3=X\,XOR\,P1 \text{ or} \qquad (2)$$

$$\text{b2) } P3=X\,XOR\,P2, \qquad (2')$$

wherein P1 and P2 are arbitrary data patterns of the same bit length of said X data pattern, c) writing (said data pattern P3 into the data section of said memory unit, thus generating respective ECC data, d) testing said ECC memory section in a ECC test run by reading out the ECC data associated with said P3 data patterns, e) stating an error, if said ECC procedure leads (275) to an incorrect result.

Thus, all bits in the memory location used to store the ECC byte are toggled, so stuck bits can be detected during the memory test.

The inventional concept can be used for memory tests, in which each memory location should be tested with different test patterns, as e.g. counter values or user data.

Advantageously, this is performed as follows:

a) writing the data P1 into memory if it does not already contain the desired data. Reading and testing the data. P1 can be different for each memory location, b) testing said memory data section with a preselected data pattern P2 in a second test run, wherein P2 is the bit complement of P1, c) testing the memory data section with pattern P3, which is X XOR P2, d) after reading and testing the data P3, writing the pattern (P3 XOR (bit complement of X)) to the memory to restore the original data without having to buffer the original data elsewhere.

Advantageously, said XOR operation is applied for recovering the input pattern P1, wherein said XOR operation (2) or (2') is solved for P1 or P2:

$$P1 = P3 \, XOR \, X \qquad (2a)$$

or $$P2 = P3 \, XOR \, X \qquad (2a')$$

or the combination $$P2 = P3 \, XOR \, \text{(bit complement of } X\text{)} \qquad (2b)$$

and applied for recovering the input pattern P3.

Thus, the memory test does not change the data patterns at all, thus it is suited for a memory test to be performed in hibernation mode of a computing processor.

Advantageously, this inventional method can be performed during boot-time or even during runtime of a computer system.

Advantageously, the computer system might be an embedded system. In this case, one takes profit from the fact that the ECC memory test needs a small amount of calculation and no extra storage buffer. This is particularly suited for the typically limited resources of an embedded system.

Advantageously, a Random Access Memory (RAM), in particular a Dynamic Memory Controller logic comprises thus a functional hardware component for performing the steps of either of the above-mentioned methods.

Thus in summary, the additional advantages result as follows:

The inventional memory and ECC test uses only 3 patterns to toggle all data and check bits.

It uses a simple XOR with a constant value to generate the 3rd test pattern.

The inventional method can be further improved by selecting an XOR value with a defined number of bits-usable values have more than 3 bits set to "1"—at certain areas, found e.g. by always flipping bits distributed over the whole data word.

The user is free to choose any data pattern.

The inventional concept and method can be used for different memory controllers with different ECC matrices, where at least one row of the ECC matrix has an even number of 1s.

They can also be used for memory controllers with ECC matrices that include one or more address bits into the ECC check bit calculation, by using a separate value Xi for each combination of included address bits.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
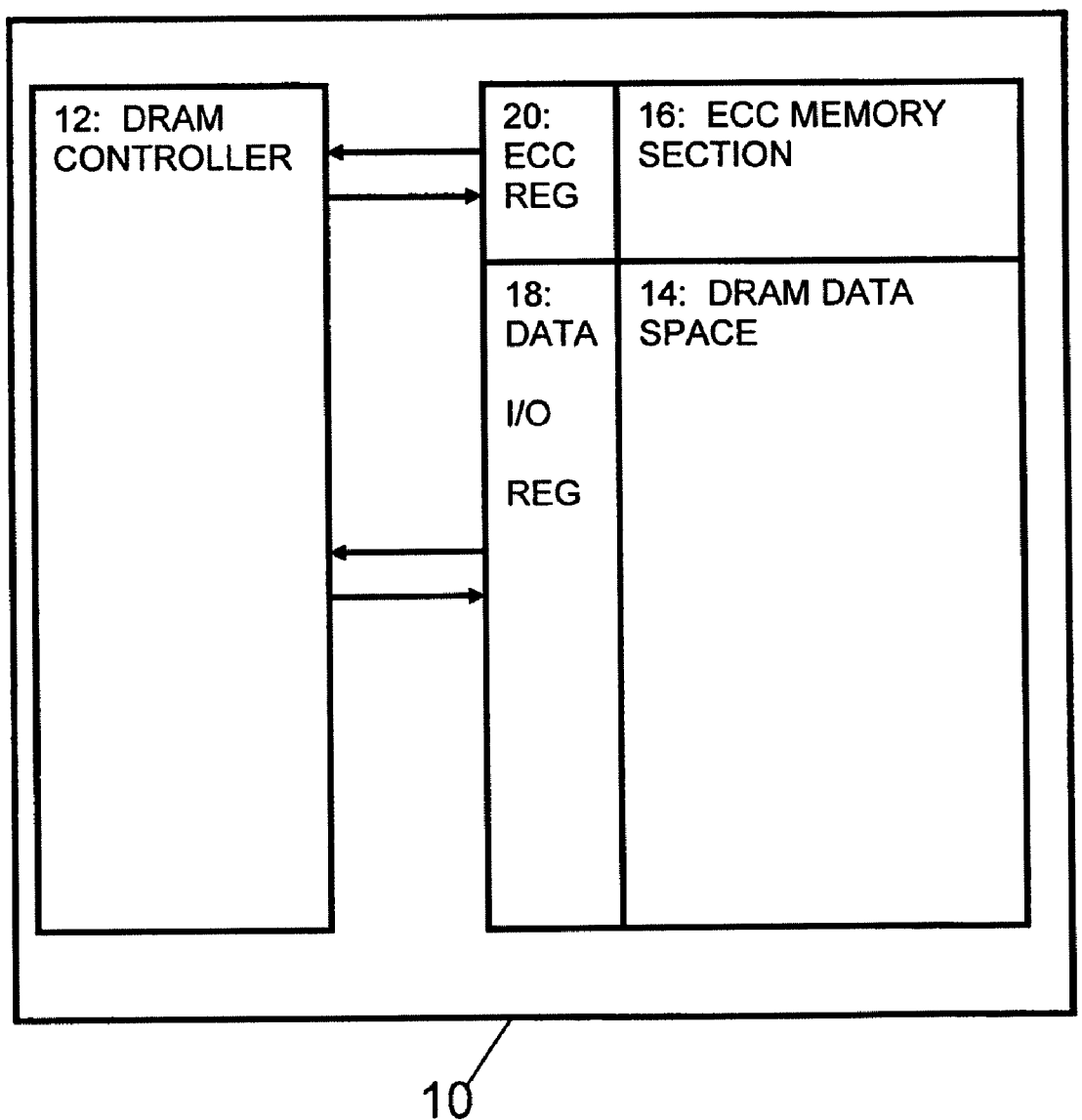
FIG. 1 is a schematic representation of the essential structural components of a DRAM memory unit including the DRAM controller.

With general reference to the figures and with special reference now to FIG. 1 a DRAM unit is depicted having an exemplary memory size of 51 megabyte including an ECC-mechanism. A DRAM controller 12 is implemented as a hard-wired logic and includes the essential steps disclosed in the present invention in form of a program implementation. The DRAM controller unit 12 can access input/output registers 18 of the DRAM memory data space 14 as well as the respective input/output registers 20 of the ECC memory section 16, which is symbolized by the arrows between the components.

Figure 2:
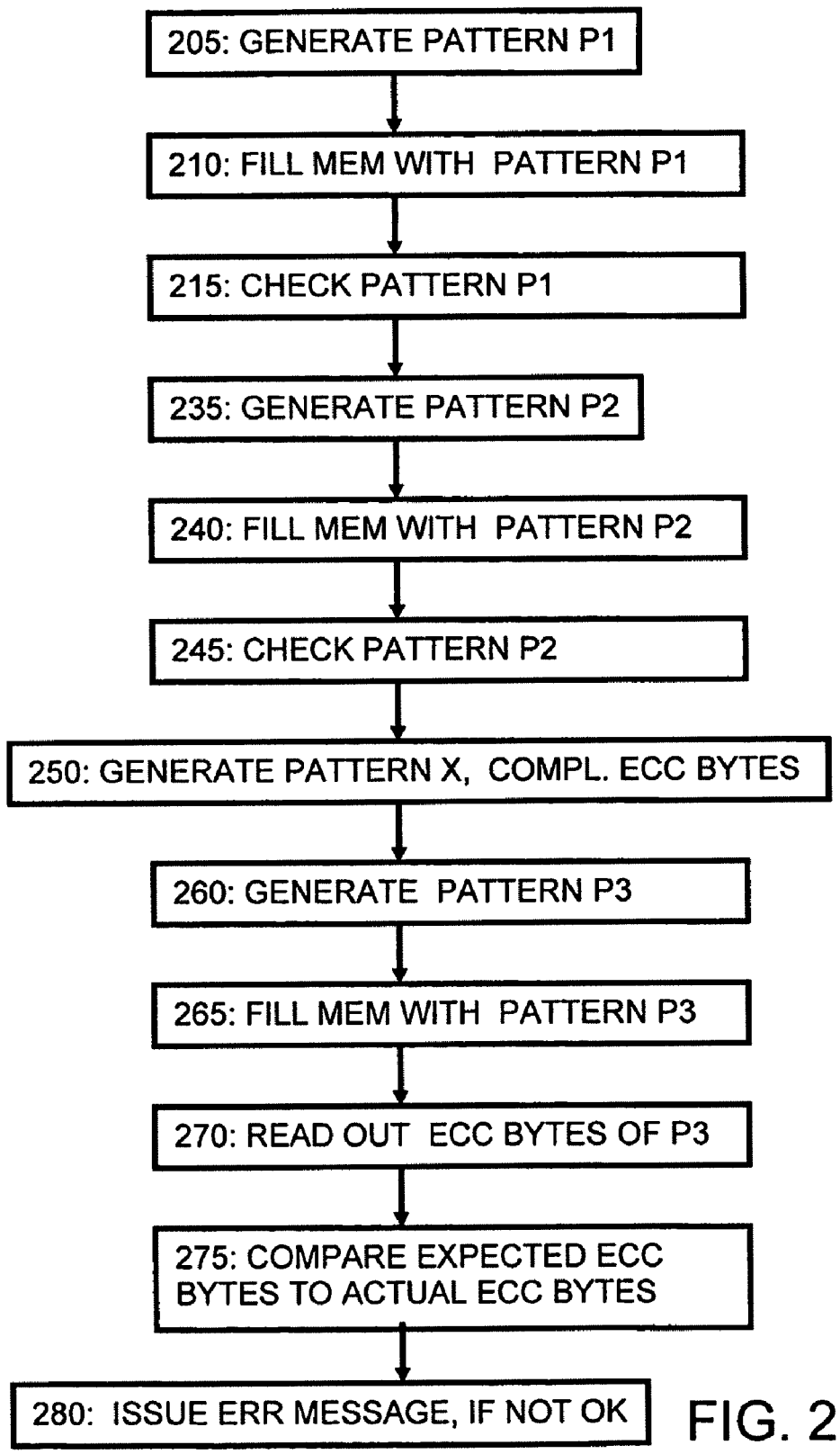
FIG. 2 is a schematic representation of the control flow illustrating the steps in a method according to a preferred embodiment of the invention.

With additional reference to FIG. 2 a preferred example of an embodiment of the inventional method is described next, which performs a complete memory check of the data section 14, as well as a complete memory check (ECC) of the ECC memory section 16. It should be noted that the very core of the present invention relates to the memory test of the ECC section 16, but the inventional method can be advantageously combined with the checking of the memory data space.

Thus, in a first step 205 a data pattern P1 is generated, which is selected from a preselected subset of possible bit settings, which are known in prior art to be particularly useful for memory test. This subset includes values for P1 with certain bits already set to 1 or others set to 0. For example P1 may be selected in a 32 bit embodiment such that 8 particular bits are set to 1, that the least significant bit is set to 1, that one bit in the second byte and in the third byte is set also to 1.

In a next step 210 the complete data space 14 in the DRAM is filled with said first pattern P1. The writing of the data pattern P1 automatically generates ECC bytes in the ECC memory section 16 according to the bit setting of P1.

In a further step 215 the first pattern P1 is checked, which means to readout the data via the I/O registers 18 of the data space 14 and comparing the value from the read register with the expected value of P1. If the data pattern readout is identical to the expected data pattern P1 nothing particular is done, as this is the usual case for a proper memory. If at any memory location, however, the data patterns differ from each other or if ECC checking shows a correctable or an uncorrectable memory error, an error message is issued indicating preferably the address of the error-comprising byte and the bit position of the one or more wrong bits.

In a next step 235 a data pattern P2 is generated, which is exactly the complement of the above-mentioned data pattern P1. Then, in steps 240 and 245 the memory data section is filled with P2 and checked according to the check of data pattern P1.

As P2 is the complement of P1 all memory locations must have been toggled from one to the other value during the preceding steps.

Then, with particular reference of the inventional ECC checking a particular data pattern X is generated in a step 250, that generates a particular ECC checksum C ("1"), i.e. a check sum C which consists of bit values of 1 (binary) or FFh (hexadecimal). This is preferably done by reading a predetermined ECC matrix from the product specification of the DRAM controller, which is a fixed constant for the DRAM unit. In particular the data pattern X is generated by solving the equation $$E*X=C(``1"") \quad (1)$$

wherein E is the above-mentioned fixed value ECC matrix having n rows and m columns, and where n is the number of data bits of the data patterns, and m is the number of the check bits in the ECC byte corresponding to a respective data pattern. The particular data pattern X, further referred to X-pattern is thus calculated according to prior art calculating using the resources of the computer system, the DRAM unit is used for. Alternatively, the X-pattern can also be stored in a hard-wired way.

In a next step 260 a data pattern P3 is generated by preferably calculating a term (2) or a term (2') by calculating $$P3=X\ XOR\ P1 \quad (2)$$

or $$P3=X\ XOR\ P2 \quad (2').$$

Then, the data section 14 of the memory is filled with said new data pattern P3 in a step 265, which will generate automatically the desired ECC bytes, which are the complement of the ECC bytes, generated by filling the memory space with either data pattern P2 or data pattern P1.

In a next step 270, the pattern P3 is read out, which causes the DRAM controller to read and check the ECC byte. If the read pattern P3 does not match, see the comparison in step 275, the corresponding read ECC pattern, an ECC error is indicated by the DRAM controller, step 280.

Thus, if either a comparison 275 of the read pattern P3 shows an error, or if the ECC checking (hardware) indicates a correctable or uncorrectable error, then the memory test issues an error message in a step 280, indicating the respective memory address of preferably both, the erroneous ECC bits or data bytes and that of the respective data address.

It should be added that in most DRAM controllers the ECC bytes cannot be read directly. Thus, the hardware logic of the DRAM controller reads out the generated ECC bytes and returns the result of the comparison in step 275 in case the comparison shows an error.

Further, beyond the before-described control flow of an inventional embodiment, further supplementary information is given, how to create the complement of C:

The Mathematics (only binary operations, "*" means matrix multiplication operator) are as follows:

$$!C=C\ XOR\ N,\ if\ N=FFh.$$

$$!C=C\ XOR\ N=(E*P)XOR(E*X)=E*(P\ XOR\ X)$$

Note: The matrix multiplication is distributive over the matrix addition.

Result:

$$N=E*X=FFh$$

This equation is solved for X with a given ECC Matrix E. The solution gives a set of data patterns Xi that all fulfill this equation. A value X that best suits the test requirements is then selected out of the set Xi.

Finally, a simplified code example is given for sake of improved clarity of the disclosure. It is directed to a sample implementation in C++ to check a 51 MByte ECC protected 32 bit wide memory.

The function ecc_checker( ) reads out the DRAM controller error register or catches an interrupt to detect corrected single-bit errors or uncorrectable errors.

The following sample code is designed for comprehensibility, not for an efficient implementation.

```
Begin of code:
const unsigned int ecc_xor = 0x00102040;
// 3 bits flipped to create p3
const unsigned int memsize = 0x03300000;
volatile unsigned int* addr;
unsigned int p1, p2, p3
// fill memory with the first pattern.
// In this example the pattern is the numeric value of the
// address itself to show a non-constant pattern.
for (addr = 0; addr < memsize; addr++)
{
    p1 = addr;
    *addr = p1;
}
// check first pattern
for (addr = 0; addr < memsize; addr++)
{
    p1 = addr;
    if (*addr != p1 || ecc_checker( ))
    {
        printf("Memory error!\n");
        return -1;
    }
}
// fill memory with the second pattern.
for (addr = 0; addr < memsize; addr++)
{
    p2 = ~addr;
    *addr = p2;
}
// check second pattern
for (addr = 0; addr < memsize; addr++)
{
    p2 = ~addr;
    if (*addr != p2 || ecc_checker( ))
    {
        printf("Memory error!\n");
        return -1;
    }
}
// fill memory with the ECC-byte checking pattern.
for (addr = 0; addr < memsize; addr++)
{
    p3 = addr ^ ecc_xor;
    *addr = p3;
}
// check ECC-byte pattern
for (addr = 0; addr < memsize; addr++)
{
```

```
    p3 = addr;
    if (*addr != p3 || ecc_checker( ))
    {
        printf("Memory error toggling the ECC check byte!\n");
        return −1;
    }
}
end of code
```

The present invention can be basically realized in hardware, software, or a combination of hardware and software. Any kind of computer system or other apparatus adapted for carrying out the methods described herein is suited. A typical combination of hardware and software could be a general-purpose computer system with a computer program that, when being loaded and executed, controls the computer system such that it carries out the methods described herein.

The present invention can also be embedded in a computer program product stored on a computer usable medium, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following
a) conversion to another language, code or notation;
b) reproduction in a different material form.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A Random Access Memory Controller logic for a memory unit comprising a data section and an Error Correction Code (ECC) memory section, the Random Access Memory Controller logic comprising a functional hardware component implementing a functional component for performing:
    (a) supplying a data pattern X, that generates a predetermined ECC checksum C by solving equation (1):

$$E*X=C, \qquad (1)$$

wherein:
    C is a check bit string consisting of m bits, wherein all bits have a logical value of "1", X is a data pattern consisting of n bits fulfilling said equation (1), E is a known n×m ECC matrix, and wherein n is a number of data bits and m is a number of check bits;
    (b) generating a data pattern P3 by calculating a term (2) or (2'):

$$P3=X\,XOR\,P1 \text{ or} \qquad (2)$$

$$P3=X\,XOR\,P2, \qquad (2')$$

wherein P1 and P2 are arbitrary data patterns of a same bit length as said X data pattern;
    (c) writing said data pattern P3 into the data section of said memory unit, thus generating respective ECC data;
    (d) testing said ECC memory section in an ECC test run procedure by reading out the ECC data associated with said P3 data patterns; and
    (e) indicating an error, if said ECC test run procedure leads to an incorrect result.

2. The Random Access Memory Controller logic according to claim 1 applied with a dynamic memory.

3. The Random Access Memory Controller logic of claim 1, wherein the functional component further performs:
    testing said data section with a preselected data pattern P1; and
    testing said data section with a preselected data pattern P2, wherein P2 is the bit complement of P1.

4. The Random Access Memory Controller logic of claim 1, wherein said XOR operation (2) or (2') is solved for P1 or P2:

$$P1=P3\,XOR\,X$$

or $$P2=P3\,XOR\,X$$

or the combination $$P2=P3\,XOR \text{ (bit complement of } X\text{)}$$

and applied for recovering the input pattern P3.

5. A computer system comprising a memory unit and a processor, the memory unit comprising a data section and an Error Correction Code (ECC) memory section, and the processor configured to perform:
    (a) supplying a data pattern X, that generates a predetermined ECC checksum C by solving an equation (1):

$$E*X=C, \qquad (1)$$

wherein:
    C is a check bit string consisting of m bits, wherein all bits have a logical value of "1", X is a data pattern consisting of n bits fulfilling said equation (1), E is a known n×m ECC matrix, and wherein n is a number of data bits and m is a number of check bits;
    (b) generating a data pattern P3 by calculating a term (2) or (2'):

$$P3=X\,XOR\,P1 \text{ or} \qquad (2)$$

$$P3=X\,XOR\,P2, \qquad (2')$$

wherein P1 and P2 are arbitrary data patterns of a same bit length as said X data pattern;
    (c) writing said data pattern P3 into the data section of said memory unit, thus generating respective ECC data;
    (d) testing said ECC memory section in an ECC test run procedure by reading out the ECC data associated with said P3 data patterns; and
    (e) indicating an error, if said ECC test run procedure leads to an incorrect result.

6. The computer system of claim 5, wherein the processor is further configured to perform:
    testing said data section with a preselected data pattern P1; and
    testing said data section with a preselected data pattern P2, wherein P2 is the bit complement of P1.

7. The computer system of claim 5, wherein said XOR operation (2) or (2') is solved for P1 or P2:

$$P1=P3\,XOR\,X$$

or $$P2=P3\,XOR\,X$$

or the combination $$P2=P3\,XOR \text{ (bit complement of } X\text{)}$$

and applied for recovering the input pattern P3.

8. A computer program product stored on a computer usable medium comprising computer readable program means for causing a computer having a memory unit comprising a data section and an Error Correction Code (ECC) memory section to perform:
(a) supplying a data pattern X, that generates a predetermined ECC checksum C by solving equation (1):

$$E*X=C, \qquad (1)$$

wherein:
C is a check bit string consisting of m bits, wherein all bits have a logical value of "1", X is a data pattern consisting of n bits fulfilling said equation (1), E is a known n×m ECC matrix, and wherein n is a number of data bits and m is a number of check bits;
(b) generating a data pattern P3 by calculating a term (2) or (2'):

$$P3=X \, XOR \, P1 \text{ or} \qquad (2)$$

$$P3=X \, XOR \, P2, \qquad (2')$$

wherein P1 and P2 are arbitrary data patterns of a same bit length as said X data pattern;
(c) writing said data pattern P3 into the data section of said memory unit, thus generating respective ECC data;
(d) testing said ECC memory section in an ECC test run procedure by reading out the ECC data associated with said P3 data patterns; and
(e) indicating an error, if said ECC test run procedure leads to an incorrect result.

9. The computer program product of claim 8, wherein the computer readable program means further cause the computer to perform:
testing said data section with a preselected data pattern P1; and
testing said data section with a preselected data pattern P2, wherein P2 is the bit complement of P1.

10. The computer program product of claim 8, wherein said XOR operation (2) or (2') is solved for P1 or P2:

$$P1=P3 \, XOR \, X$$

or $$P2=P3 \, XOR \, X$$

or the combination $$P2=P3 \, XOR \text{ (bit complement of } X)$$

and applied for recovering the input pattern P3.

* * * * *